(12) United States Patent
Alperine et al.

(10) Patent No.: US 6,312,832 B1
(45) Date of Patent: Nov. 6, 2001

(54) LOW THERMAL CONDUCTIVITY HEAT BARRIER COATING, A METAL ARTICLE HAVING SUCH A COATING, AND A PROCESS FOR DEPOSITING THE COATING

(75) Inventors: Serge Alexandre Alperine, Paris (FR); Serge Gerzdev, Moscou (RU); Yann Philippe Jaslier, Melun (FR); Yuri Tamarine, Moscou (RU)

(73) Assignee: Societe Nationale d'Etude et de Construction de Moteurs d'Aviation "Snecma", Paris (FR)

( * ) Notice: Subject to any disclaimer, the term of this patent is extended or adjusted under 35 U.S.C. 154(b) by 0 days.

(21) Appl. No.: 09/391,342

(22) Filed: Sep. 8, 1999

(30) Foreign Application Priority Data

Oct. 2, 1998 (FR) .................................................. 98 12342

(51) Int. Cl.$^7$ ...................................................... B32B 15/04
(52) U.S. Cl. .......................... 428/633; 428/469; 428/634; 428/650; 428/652
(58) Field of Search .................................... 428/469, 472, 428/633, 650, 652, 408, 634

(56) References Cited

U.S. PATENT DOCUMENTS

| 4,248,940 | 2/1981 | Goward et al. . |
| 5,843,585 | 12/1998 | Alperine et al. . |
| 6,025,078 | * 2/2000 | Rickerby et al. .................... 428/469 |

FOREIGN PATENT DOCUMENTS

| 0 799 904 | 10/1997 | (EP) . |
| 2 737 504 | 2/1997 | (FR) . |

* cited by examiner

*Primary Examiner*—Deborah Jones
*Assistant Examiner*—Jennifer McNeil
(74) *Attorney, Agent, or Firm*—Oblon, Spivak, McClelland, Maier & Neustadt, P.C.

(57) ABSTRACT

A low thermal conductivity heat barrier coating deposited on a superalloy substrate is characterised in that it comprises a homogeneous mixture of oxides and has a composition containing a zirconia base, a zirconia-stabilizing oxide, and from 0.5 to 12 weight % of an additional metal element selected from nickel, cobalt, iron and mixtures thereof. The additional metal element may be added in an oxidised form, and the coating may also contain from 0.01 to 1 weight % of carbon.

22 Claims, 1 Drawing Sheet

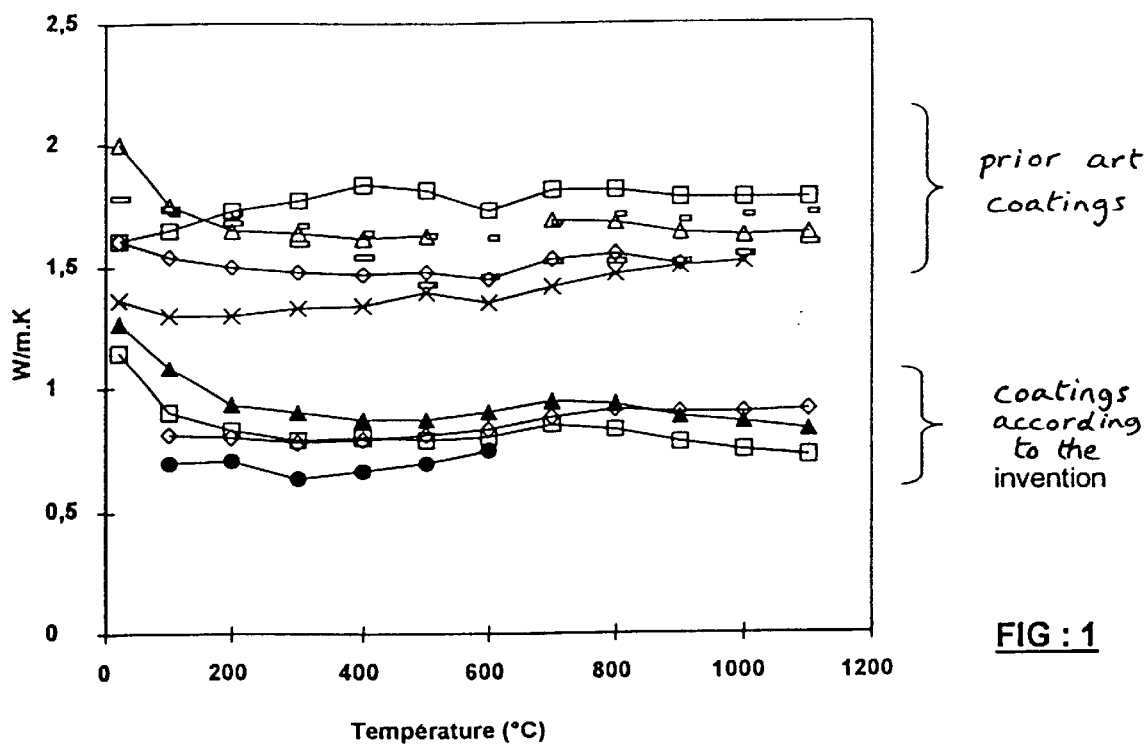
FIG : 1
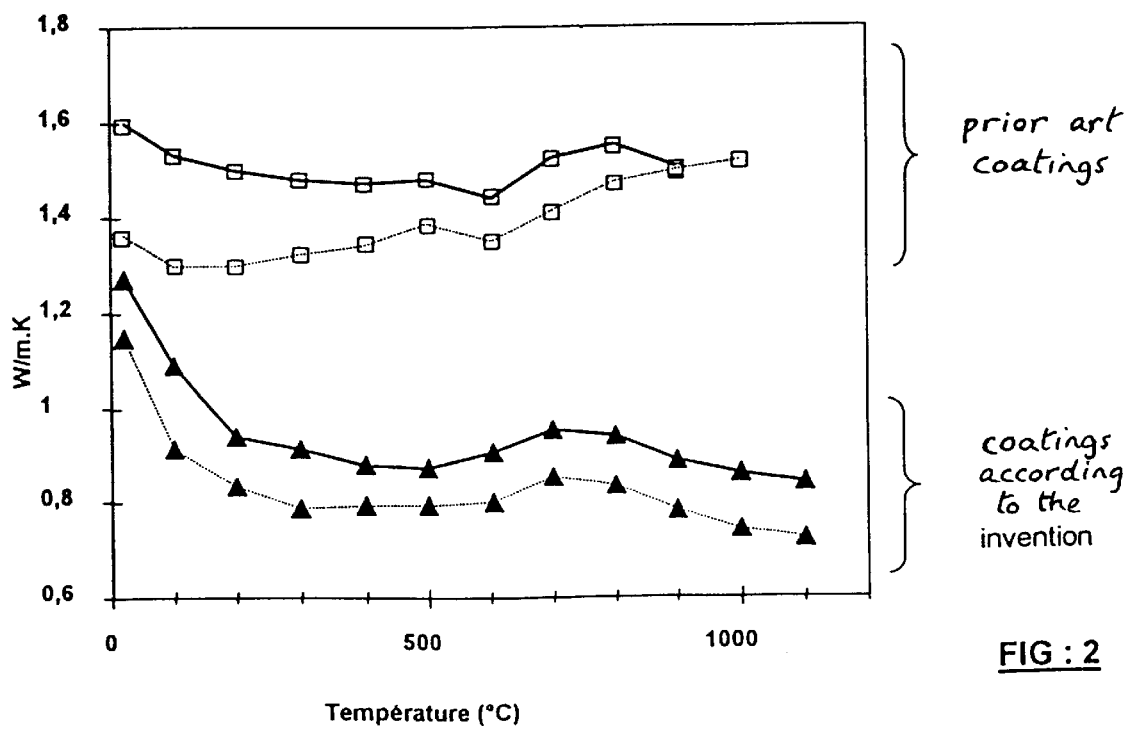
FIG : 2

LOW THERMAL CONDUCTIVITY HEAT BARRIER COATING, A METAL ARTICLE HAVING SUCH A COATING, AND A PROCESS FOR DEPOSITING THE COATING

BACKGROUND OF THE INVENTION

1. Field of the Invention

The invention relates to a low thermal conductivity heat barrier coating, metal articles protected by the coating, and to a process for depositing the coating.

2. Summary of the Prior Art

For more than 30 years the makers of turbine engines for both land and aeronautical use have been tackling the problems of increasing the efficiency of such engines, reducing their specific fuel consumption, and reducing polluting emissions of the $CO_x$, $SO_x$ and $NO_x$ type as well as unburnt constituents. One way of dealing with these demands is to get close to the combustion stoichiometry of the fuel and thus to increase the temperature of the gases leaving the combustion chamber and entering the first stages of the turbine.

It has therefore been necessary to adapt the turbine to this increase in combustion gas temperature. One solution adopted has been to improve the techniques for cooling the turbine blades, which has led to a considerable increase in the complexity and cost of the blades. Another solution has been to improve the refractory nature of the materials used in terms of peak working temperature, creep and fatigue life. This solution has been used since the development of the nickel and/or cobalt based superalloys, and underwent a considerable technical advance in the changeover from equiaxial superalloys to monocrystalline (single-crystal) superalloys, giving an 80 to 100° C. improvement in creep resistance. Further developments along this route can only be made with substantial development costs, giving so-called third generation superalloys having an additional gain in creep resistance of about 20° C. Beyond this a change in the family of materials is required.

An alternative to such a change is to deposit a thermally-insulating ceramic heat barrier coating on superalloy articles which are subjected to high temperatures. This ceramic coating makes it possible for a cooled article to have, during operation, a thermal gradient through the ceramic which is possibly in excess of 200° C. The operating temperature of the metal below is reduced in proportion, with a considerable effect on the amount of cooling air required, the working life of the article, and the specific consumption of the engine.

The ceramic coating may be deposited on the article to be coated by various processes, most of which belong to two different categories, namely sprayed coatings and physically deposited vapour phase coatings. Other deposition processes of the chemical vapour phase kind assisted by plasma can also be used.

In the case of sprayed coatings a zirconia-based oxide is deposited by a technique related to plasma spraying. The coating consists of a stack of molten ceramic droplets which are then quenched, flattened and stacked to form an incompletely densified deposit of a thickness between 50 $\mu$m and 1 mm. One of the characteristics of this kind of coating is intrinsically high roughness (the roughness Ra, being typically between 5 and 35 $\mu$m). The degradation in service most often associated with this coating is the slow propagation of a crack in the ceramic parallel to the ceramic-to-metal interface.

The problem is quite different in the case of coatings deposited by physical vapour phase deposition. This deposition can be made by evaporation under electron bombardment. Its main characteristics is that the coating consists of an assembly of very thin columns (typically between 0.2 and 10 $\mu$m) extending substantially perpendicularly to the surface to be coated. The thickness of such a coating can be between 20 and 600 $\mu$m. An assembly of this kind has the useful property of reproducing without impairment the surface texture of the covered substrate. In particular, in the case of turbine blades a final roughness considerably less than 1 micrometer can be obtained, which is very advantageous for the aerodynamic properties of the blade. Another consequence of the columnar structure of physical vapour phase ceramic depositions is that the gap between the columns enables the coating to deal very effectively with compression stresses arising in operation due to differential expansion relative to the superalloy substrate. In this case long working lives can be achieved in respect of high-temperature heat fatigue, and the coating tends to rupture near the sublayer-ceramic interface.

Chemical vapour phase deposition techniques produce coatings whose morphology is columnar and substantially equivalent to that of physical vapour phase depositions. In both physical and chemical vapour phase depositions the oxide formation results from a molecular reaction between metal atoms or ions and oxygen.

Heat barrier coatings consist of a mixture of oxides, generally with a zirconia base. This oxide has a relatively low thermal conductivity and a relatively high coefficient of expansion close to that of the nickel and/or cobalt based alloys on which it is required to deposit the oxide. One of the most satisfactory ceramic compositions is zirconia totally or partially stabilized by an oxide such as, for example, yttrium oxide: $ZrO_2$+6 to 8 weight % of $Y_2O_3$. The function of the yttrium oxide is to stabilize the cubic allotropic variety C and/or the non-transformable tetragonal variety t' of the zirconia and thus avoid martensitic phase transitions in swings between ambient temperature and the high operating temperature of the article.

The main function of a heat barrier coating is to slow down heat exchange between an external medium consisting of hot gases and the covered metal article, the latter usually being cooled by a forced flow of cold gases. Heat exchange between the ceramic coating and the metal below can be by conduction and, to some extent, by radiation. The thermal conductivity of the ceramic coating is the parameter which measures its effectiveness in slowing down heat conduction. Heat exchange by radiation is basically determined by the transparency or semi-transparency of the coating to the incident radiation, but the semi-transparency effect of the ceramic is of secondary importance in relation to conduction in the heat transfer process. Thermal conductivity is therefore the most important parameter which needs to be controlled to reduce heat transmission in the coatings.

There are a number of methods for reducing the thermal conductivity of the coating, and these are based on the fact that heat barrier coatings are porous ceramic layers and the thermal conductivity of the coating is that of a heterogeneous assembly of two heat-conducting media, namely the ceramic material itself with an intrinsic conductivity $\lambda$intr, and the pores or microcracks of the coating whose conductivity is close to that of the air which fills them under operating conditions.

The effective conductivity $\lambda$actual of the coating is between $\lambda$intr and the conductivity of air $\lambda$air. It can in fact be stated that λactual is a complex function of λintr, λair, and the morphology of the coating.

A first solution for obtaining a low thermal conductivity coating is to use a ceramic of a conventional ceramic composition, for example, zirconia partially stabilized by 6 to 8 weight % of yttrium oxide, and to modify the coating morphology—i.e., the proportion, distribution and orientation of the pores or microcracks of the coating, or the arrangement of the material in columnar or layer form so as to reduce λactual. This result can be achieved by modifying the coating deposition parameters.

A second solution is to modify the chemical composition of the coating in an attempt to reduce λintr directly without impairing the coating morphology, while retaining the other properties of the coating. This is the solution used in the present invention.

SUMMARY OF THE INVENTION

It is an object of the invention to provide a novel chemical composition for achieving a low thermal conductivity heat barrier coating.

The solution proposed by the invention consists of preparing a conventional heat barrier composition comprising zirconia partly stabilized by an oxide, and adding to it another metal element Me, possibly in its oxidised form $Me_xO_y$, capable of significantly increasing the quantity of oxygen lacunae present in the crystalline network of the zirconia while preserving its other main characteristics such as, for example, the nature of the phases, its coefficient of expansion and its refractoriness.

Accordingly, the invention provides a low thermal conductivity heat barrier coating deposited on a superalloy substrate, said coating comprising a homogeneous mixture of oxides and having a composition containing, at least, a zirconia base, a zirconia-stabilizing oxide, and from 0.5% to 12% by weight of an additional metal element selected from the group consisting of nickel, cobalt, iron, and mixtures thereof.

Preferably, the proportion of the additional metal element in the coating is between 1.5 and 5 weight %. The metal element may also be introduced in its oxidised form.

Advantageously, the coating composition may also contain from 0.01 to 1 weight %, preferably from 0.02 to 0.1 weight %, of carbon.

The invention also relates to a metal article made of a superalloy and having a surface at least partially covered by a low thermal conductivity heat barrier coating in accordance with the invention.

Other preferred features and advantages of the invention will become apparent from the following non-limitative examples and description given with reference to the accompanying drawings.

BRIEF DESCRIPTION OF THE DRAWINGS

FIG. 1 is a comparative graph in which thermal conductivity is plotted against temperature for various prior art coatings and coatings in accordance with the invention; and FIG. 2 is a comparative graph in which the thermal conductivity of different coatings is plotted against temperature before and after annealing each coating at 1100° C. in air for 150 hours.

DETAILED DESCRIPTION OF THE INVENTION AND PREFERRED EXAMPLES

In our search for a new chemical composition for a ceramic heat barrier coating we have found that adding an additional metal element or metal oxide, such as nickel, cobalt or iron, or nickel oxide, cobalt oxide or an iron oxide, to a partially or totally stabilized zirconia-based composition leads to a ceramic coating having a reduced thermal conductivity.

We have also found that the addition of carbon in small quantities of from 0.01 to 1.0 weight %, preferably from 0.02 to 0.1 weight % has a very appreciable effect on reducing the thermal conductivity of the coating. The aim of adding carbon to the coating is to boost the non-stoichiometric crystallisation of the oxide coating. This result is achieved by means of solid/gas reactions in the coating such as:

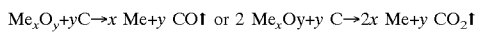

$Me_xO_y+yC \rightarrow x\ Me+y\ CO\uparrow$ or $2\ Me_xOy+y\ C \rightarrow 2x\ Me+y\ CO_2\uparrow$ An appreciable quantity of CO or $CO_2$ may be trapped in the crystalline network of the ceramic and in the micropores of its structure, thereby contributing to reducing thermal conductivity.

A coating in accordance with the invention may be made as described in any one of the following examples 1 to 3.

EXAMPLE 1

A refractory alloy article, preferably made of a nickel and/or cobalt based superalloy, is used as a substrate. The article is coated with a metallic sublayer by a known process. The sublayer may be an alumino-forming alloy of the MCrAlY type resistant to oxidising corrosion (M=Ni and/or Co and/or Fe), or a nickel or cobalt aluminide which may or may not have been modified by the addition of chromium and one or more platinum group precious metals selected from platinum, palladium, ruthenium, iridium, osmium and rhodium. This range of possible sublayers is not limitative and is given purely by way of non-limiting example. The sublayer may be deposited on the substrate by a heat spraying process, an electron beam evaporation process (EB-PVD), or a chemical vapour phase deposition process (CVD or thermochemical deposition). The thickness of the sublayer may be between 30 and 150 μm, and is preferably between 50 and 120 μm.

The ceramic coating may then be deposited in a deposition installation by electron beam evaporation. To this end, a mixture of powders of zirconia, yttrium oxide and an additional metal element comprising nickel and/or cobalt and/or iron, possibly in an oxidised form, is mixed and then shaped and sintered into rod form, so that the average composition of the rod comprises a $ZrO_2$ base, from 3 to 15 weight % of $Y_2O_3$, and from 0.5 to 12 weight %, preferably from 1.5 to 5 weight %, of the additional metal element and/or its oxide.

The initial grain size of the powders and the rod sintering conditions (temperature, pressure and duration) are chosen in a known manner so as to obtain an end product which can be evaporated in an electron beam evaporation deposition installation. More particularly, care is taken to ensure that the macroscopic homogeneity of the composition of the rod and the level of residual porosity are suitable (for example between 25 and 50%).

The article to be coated is introduced into an EBPVD deposition chamber in which the sintered rod to be evaporated has already been placed. After the chamber has been exhausted and the article pre-heated, the or each electron beam generator of the chamber is focused in a known manner on that part of the rod which extends out of the crucible so that the rod surface evaporates and condenses on the article which is placed opposite.

Since there is little difference between the heat per unit mass of evaporation of the various elements present in the rod, a homogeneous mixture of the various constituents (zirconium, yttrium, nickel and/or cobalt and/or iron, oxygen) is produced in the gas phase in proportions substantially identical to the proportions in the rod. Analysis shows that the coating composition correlates well with the average composition of the rod as hereinbefore explained.

Also, the mixture of the constituents in the vapour phase leads to a completely homogeneous coating composition. The article is kept opposite the vapour evolved from the rod for long enough to build on the article surface a coating having a thickness of between 20 and 400 µm, preferably between 70 and 250 µm. The resulting coating exhibits a structure consisting of the juxtaposition of columns substantially perpendicular to the article surface, as is usually found with EBPVD zirconia depositions. The colour of the coating is black or dark grey, whereas the colour of a prior art coating—i.e., a coating produced in identical conditions but without nickel, cobalt or iron in the rod—and therefore in the coating, is white or pale yellow or a very light grey.

An X-ray diffraction study of the crystallographic structure of the coating shows that it is mainly composed of the tetragonal and metastable phase t' of the zirconia but also contains very small quantities of nickel oxide and/or cobalt oxide and/or iron oxide.

Alloy specimens were coated in this way and the thermal conductivity of the coatings were measured and compared with the thermal conductivity measured for the coatings of identical specimens coated in accordance with the prior art—i.e., without nickel, cobalt or iron in the coating. The results obtained are shown in FIG. 1, the value of the coating thermal conductivity being measured from ambient temperature to 1100° C. for a number of coatings according to the invention and for a number of commercial coatings corresponding to the prior art. It is clearly apparent from FIG. 1 that the coatings in accordance with the invention almost halve the thermal conductivity of the heat barrier as compared with the prior art coatings.

The influence of high-temperature aging of the coatings on their conductivity was also studied. This is an important consideration to ensure that the conductivity values are permanent when the coated articles are operated at high temperature. To this end, the specimens made according to the invention and according to the prior art were annealed at approximately 1100° C. in air for 150 hours before having their conductivity re-measured. The results are shown in FIG. 2, the triangular symbols representing the specimens according to the invention and the square symbols representing the prior art specimens. The dotted line curves represent the specimens immediately after deposition of the coating, and the solid-line curves represent the aged specimens. Clearly, in all cases the thermal conductivity rises slightly during annealing, but this effect is no more marked for the coatings according to the invention than for the prior art coatings. The advantages of the coatings according to the invention remains obvious even after aging.

EXAMPLE 2

The procedure of Example 1 is followed to produce a ceramic coating having the following composition:

| Components | Weight % |
|---|---|
| $ZrO_2$ | base |
| $Y_2O_3$ | 3–15% |

Ni and/or Co and/or Fe and/or their oxides: 0.5 to 12% (preferably 1.5 to 5%)

Carbon: 0.01 to 1% (preferably 0.02 to 0.1%)

The aim of adding carbon to the coating is to boost crystallisation of the oxide coating in a non-stoichiometric form.

The carbon may be added to the coating by making the rod as described in Example 1 using an at least partially organic carbon-rich solvent, such as a polyvinyl alcohol, as a binder for the ceramic powders before sintering. When the powders are sintered at a moderate temperature some of the solvent remains in the form of carbonised residues trapped between the ceramic powder grains. These carbon particles are subsequently evaporated with the oxides during the formation of the coating and some of the carbon condenses on the article during deposition. The quantity of organic solvent initially used in the making of the rod and the sintering conditions thereof are adjusted to obtain the required residual carbon content in the deposit. Preferably, a chamber in which there is no addition of oxygen during deposition is used to make such a deposit.

Alternatively, the required quantity of carbon can be introduced into the coating by introducing into the deposition chamber a light gas flow containing a crackable carbon precursor gas. By way of non-limitative example suitable gases are methane, ethane, butane, propane and their equivalents in the families of the alkenes and alkynes. The carbon precursor gas can be diluted in a carrier gas to adjust the flow introduced in accordance with the quantity of carbon required to be incorporated in the ceramic coating.

The coatings obtained in this example have crystallographic characteristics similar to those of the deposits described in Example 1. The thermal conductivity of the Example 2 deposits is even lower than the thermal conductivity of the Example 1 deposits.

EXAMPLE 3

A substrate and an anti-oxidising-corrosion sublayer are used as described in Example 1.

The ceramic coating is produced by plasma spraying. For this purpose ceramic powders having the following composition are used:

| Components | Weight % |
|---|---|
| $ZrO_2$ | base |
| $Y_2O_3$ | 3–15% |

Ni and/or Co and/or Fe and/or their oxides: 0.5 to 12% (preferably 1.5 to 5%)

In contrast to the two previous examples it is not enough to use a mixture of powders of the various oxides and it is necessary to use pre-alloyed powders such that the composition of each grain of powder is substantially equal to the rated composition hereinbefore given. By way of example such powder may be produced in a known manner by atomization and drying processes which may or may not be followed by a consolidating heat treatment in a furnace or by inductive plasma, by melting and crushing processes, or by sol-gel processes.

An insulating ceramic deposit having substantially the same composition as the rated composition of the powder is then produced by plasma spraying. The resulting ceramic coating is a heat barrier coating having a very low thermal conductivity which may be as low as 0.5 W/m.K at 1000° C.

What is claimed is:

1. A low thermal conductivity heat barrier coating deposited on a superalloy substrate, said coating comprising a homogeneous mixture of oxides and having a composition containing, at least, a zirconia base, a zirconia-stabilizing oxide, and from 0.5% to 12%, by weight, of an additional metal element selected from the group consisting of nickel, cobalt, iron, and mixtures thereof wherein the composition of said coating also includes from 0.01 to 1%, by weight, of carbon.

2. A coating according to claim 1, wherein the proportion of said selected metal element in the coating is between 1.5% and 5% by weight.

3. A coating according to claim 1, wherein said additional metal element is introduced in oxidized form.

4. A coating according to claim 1, wherein the proportion of carbon in the coating is between 0.02% and 0.1% by weight.

5. A coating according to claim 1, wherein the zirconia-stabilizing oxide is yttria.

6. A coating according to claim 5, wherein the proportion of yttria is between 3% and 15%.

7. A coating according to claim 1, wherein the homogeneous mixture of oxides is deposited on said substrate by electron beam evaporation from a rod having a composition containing, at least, a $ZrO_2$ base, from 3 to 15 weight % of $Y_2O_3$, and from 0.5 to 12 weight % of an additional component selected from the group consisting of Ni, Co, Fe, and oxides thereof.

8. A coating according to claim 7, wherein the rod also contains carbon.

9. A coating according to claim 1, wherein the homogeneous mixture of oxides is deposited on said substrate by hot spraying.

10. A coating according to claim 9, wherein the homogeneous mixture of oxides is deposited by plasma spraying.

11. A coating according to claim 1, wherein the homogeneous mixture of oxides is deposited on said substrate by a chemical vapor phase deposition process.

12. A coating according to claim 11, wherein said chemical vapor phase deposition process is assisted by a plasma.

13. A coating according to claim 1, wherein there is a metallic sublayer of an aluminoforming alloy deposited between said substrate and said homogeneous mixture of oxides.

14. A coating according to claim 13, wherein said sublayer is a deposit of nickel aluminide.

15. A coating according to claim 14, wherein the nickel aluminide includes at least one metal selected from the group consisting of platinum group precious metals, yttrium, and the rare earths.

16. A coating according to claim 15, wherein the sublayer is a deposit of an alloy of the MCrAlY type in which M denotes at least one metal selected from the group consisting of nickel, cobalt and iron.

17. A metal article made of a superalloy and having a surface at least partly covered by a heat barrier coating according to claim 1.

18. A process for making a low thermal conductivity heat barrier coating on a superalloy substrate, the process comprising the steps of:

mixing powders of zirconia, a zirconia-stabilizing oxide, and an additional metal element selected from nickel, cobalt and iron to form a powder mixture;

shaping and sintering said powder mixture to form a rod;

placing said rod and the substrate to be coated into an electron beam physical vapor deposition chamber; and exhausting said chamber, preheating the substrate, and focusing electron beams on said rod to vaporize the elements present therein so that the elements condense on the superalloy substrate; and forming the coating of claim 1.

19. A process according to claim 18, wherein said powder mixture is mixed with a binder comprising an at least partly organic carbon-rich solvent prior to being shaped and sintered to form said rod.

20. A process according to claim 19, wherein said solvent is a polyvinyl alcohol.

21. A process according to claim 18, including the step of introducing a gas flow containing at least one crackable carbon precursor gas into the deposition chamber in the immediate vicinity of the substrate to be coated.

22. A process according to claim 21, wherein said carbon precursor gas is selected from methane, ethane, butane, propane, gases of the alkene family, and gases of the alkyne family.

* * * * *